United States Patent
Branciforte et al.

(10) Patent No.: US 11,300,596 B2
(45) Date of Patent: Apr. 12, 2022

(54) ELECTRONIC DEVICE, CORRESPONDING APPARATUS, METHOD AND COMPUTER PROGRAM PRODUCT

(71) Applicant: STMicroelectronics S.r.l., Agrate Brianza (IT)

(72) Inventors: Marco Maria Branciforte, Catania (IT); Luigi Fortuna, Syracuse (IT); Arturo Buscarino, Tremestrieri Etneo (IT); Maide Bucolo, Catania (IT); Fernando Nuwan Poruthotage, Sant'Agata li Battiati (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 120 days.

(21) Appl. No.: 16/907,696

(22) Filed: Jun. 22, 2020

(65) Prior Publication Data

US 2020/0408819 A1 Dec. 31, 2020

(30) Foreign Application Priority Data

Jun. 27, 2019 (IT) .................. 102019000010269

(51) Int. Cl.
*G01R 23/00* (2006.01)
*G01R 31/58* (2020.01)
*H02J 13/00* (2006.01)
*H02J 3/00* (2006.01)

(52) U.S. Cl.
CPC .......... *G01R 23/005* (2013.01); *G01R 31/58* (2020.01); *H02J 13/00002* (2020.01); *H02J 3/001* (2020.01)

(58) Field of Classification Search
CPC ..... G01N 33/18; G01W 1/10; G05B 23/0254; G05B 23/027; G06N 5/04; G06N 20/00
See application file for complete search history.

(56) References Cited

U.S. PATENT DOCUMENTS

| 4,349,878 A | 9/1982 | Grimm |
| 7,490,013 B2 | 2/2009 | Wells |

(Continued)

OTHER PUBLICATIONS

IT Search Report and Written Opinion for IT Appl. No. 102019000010269 dated Nov. 11, 2019 (7 pages).

*Primary Examiner* — Mohammad K Islam
(74) *Attorney, Agent, or Firm* — Crowe & Dunlevy

(57) ABSTRACT

An oscillatory electric signal having an oscillation frequency is processed by time-sampling to generate a sampled oscillatory electric signal. A nonlinear circuit driven by the sampled oscillatory electric signal outputs a hysteretic response signal as a function of the sampled oscillatory electric signal. The hysteretic response signal has a frequency in a first frequency range as a result of an increase in the oscillation frequency of the oscillatory electric signal, and a frequency in a second frequency range as a result of a decrease in the oscillation frequency of the oscillatory electric signal. A detection circuit processes the hysteretic response signal to compute an envelope signal of the hysteretic response signal, perform a comparison of the envelope signal with a threshold, and produce a signal indicative of an increase or a decrease in the oscillation frequency of the oscillatory electric signal as a result of the outcome of the comparison.

11 Claims, 4 Drawing Sheets

(56) References Cited

U.S. PATENT DOCUMENTS

| | | | |
|---|---|---|---|
| 8,766,716 B2 * | 7/2014 | Paek | H03F 3/2178 |
| | | | 330/136 |
| 9,806,675 B2 * | 10/2017 | Yang | H03F 3/45475 |
| 9,843,260 B1 * | 12/2017 | Paek | H03F 3/2173 |
| 10,386,808 B2 * | 8/2019 | Tian | G05B 19/042 |

* cited by examiner

ELECTRONIC DEVICE, CORRESPONDING APPARATUS, METHOD AND COMPUTER PROGRAM PRODUCT

PRIORITY CLAIM

This application claims the priority benefit of Italian Application for Patent No. 102019000010269, filed on Jun. 27, 2019, the content of which is hereby incorporated by reference in its entirety to the maximum extent allowable by law.

TECHNICAL FIELD

The description relates to a method for generating a signal indicating a drift in an analog oscillating signal.

One or more embodiments may be applied to electric power grids and, more specifically, to power grid failure detection or for power grid predictive maintenance.

BACKGROUND

Detecting frequency drifts occurring in analog oscillatory signals, and identifying whether such analog signal frequency is increasing or decreasing, may facilitate predictive maintenance of systems.

The problem of frequency drifts is particularly relevant in controlling power grid performance, where all the generators should share the same frequency in order to maintain the grid performance. Electric power grids that carry electrical power to homes and businesses are sometimes prone to failure, resulting in a blackout for the affected areas.

Power grid operators and systems try to keep the AC frequency as close to a fixed frequency as possible. For example, the nominal AC frequency of the power grid in Europe is 50 Hz, while in the United States the nominal AC frequency is 60 Hz. During operation, the actual AC frequency value may drift around the nominal AC frequency value, for instance as a result of load and generation effects.

Existing solutions for monitoring frequency drifts may employ power analyzers. In general, a spectral analysis performed by digitally implemented Fast Fourier Transform may be used to detect a frequency drift. For instance, such a solution is discussed in U.S. Pat. No. 7,490,013 (incorporated by reference).

However, both power analyzers and digital FFT use (computer-implemented) algorithms whose computational complexity can slow down the performance of the system. Other drawbacks of the existing solutions may include:
the use of several specifically designed devices,
time-consumption and latency, for instance several clock cycles can be used to perform a digital Fast Fourier Transform,
low reusability and reconfigurability, since existing system may detect solely frequency drifts within a limited range of frequencies.

There is a need in the art to contribute in providing an improved solution.

SUMMARY

According to one or more embodiments, a method is presented for detecting a (drift of) frequency in an oscillatory signal.

One or more embodiments may relate to a corresponding device.

A sensor for power grid monitoring may be exemplary of such a device.

One or more embodiments may relate to a corresponding apparatus.

An apparatus for controlling an oscillatory signal generator may be exemplary of such apparatus.

One or more embodiments may relate to the method as a computer-implemented method.

One or more embodiments may relate to a corresponding computer program product.

One or more embodiments may comprise a computer program product loadable in the memory of at least one processing circuit (e.g., a computer) and comprising software code portions for executing the steps of the method when the product is run on at least one processing circuit. As used herein, reference to such a computer program product is understood as being equivalent to reference to computer-readable medium containing instructions for controlling the processing system (for instance, a micro-controller) in order to co-ordinate implementation of the method according to one or more embodiments. Reference to "at least one computer" is intended to highlight the possibility for one or more embodiments to be implemented in modular and/or distributed form.

One or more embodiments may be based on the exploitation of jump resonance phenomenon in non-linear systems, which is often regarded as a detrimental parasitic effect, as a fast frequency drift detection tool.

One or more embodiments use a device based on discrete-time nonlinear dynamical systems to detect frequency of a given signal and its trends (increasing/decreasing), without performing a spectral analysis.

One or more embodiments may be reconfigurable, facilitating obtaining the detection of frequency drifts in various bands by changing even just one parameter.

One or more embodiments may facilitate avoiding the use of on-chip solutions for spectral analysis of signals.

One or more embodiments may advantageously use digital signal processing approaches to detect frequency drifts in oscillatory signals, using a reduced amount of computational resources.

One or more embodiments facilitate the use of dedicated programmable devices as sensors, wherein the frequency drift detection is a result of the dynamical behavior of a jump resonance system, providing on-line fast and reliable results.

One or more embodiments may facilitate the use of programmable devices as non-linear systems.

BRIEF DESCRIPTION OF THE DRAWINGS

One or more embodiments will now be described, by way of non-limiting example only, with reference to the annexed Figures, wherein.

DETAILED DESCRIPTION

Figure 1:
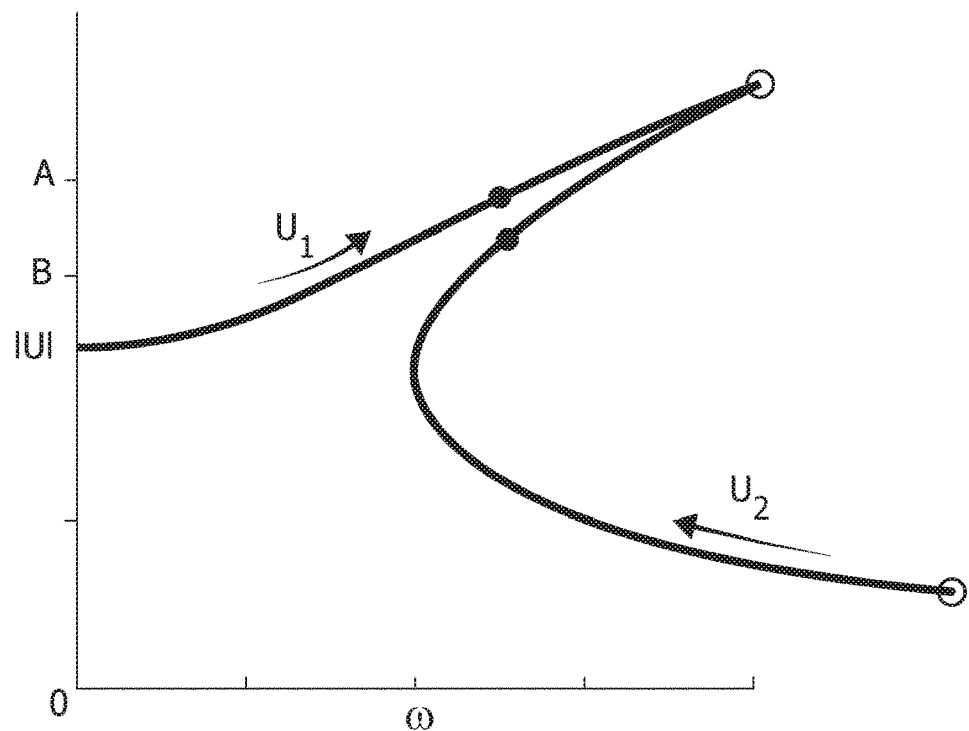
FIG. 1 is an exemplary diagram of working principle of non-autonomous non-linear dynamical systems.

In the ensuing description, one or more specific details are illustrated, aimed at providing an in-depth understanding of examples of embodiments of this description. The embodiments may be obtained without one or more of the specific details, or with other methods, components, materials, etc. In other cases, known structures, materials, or operations are not illustrated or described in detail so that certain aspects of embodiments will not be obscured.

Reference to "an embodiment" or "one embodiment" in the framework of the present description is intended to indicate that a particular configuration, structure, or characteristic described in relation to the embodiment is comprised in at least one embodiment. Hence, phrases such as "in an embodiment" or "in one embodiment" that may be present in one or more points of the present description do not necessarily refer to one and the same embodiment.

Moreover, particular conformations, structures, or characteristics may be combined in any adequate way in one or more embodiments.

The references used herein are provided merely for convenience and hence do not define the extent of protection or the scope of the embodiments.

One or more embodiments may exploit a property of non-autonomous nonlinear dynamical systems.

A linear dynamical system is a system in which a relatively small change in an initial condition of the system produces a relatively small and quantifiable or predictable change in an output state of the system.

Frequency response is the quantitative measure of the output spectrum of a system or device in response to a stimulus, and is used to characterize the dynamics of the system. It is a measure of magnitude and phase of the output as a function of frequency, in comparison to the input. In simplest terms, if a sine wave is injected into a system at a given frequency, a linear system will respond at that same frequency with a certain magnitude and a certain phase angle relative to the input. In other words, the magnitude of a frequency response of a linear system is characterized by a single valued curve $|G(j\omega)|$, where w is the frequency of the input signal.

Conversely, a nonlinear dynamical system may exhibit a relatively sensitive dependence on system initial conditions. Thus, a relatively small or even a virtually unmeasurable difference in system initial conditions can result in nonpredictable system output states. Such output states may, in some instances, have relatively large differences between them despite the relatively small differences in initial conditions of the system.

Nonlinear systems receiving a driving signal may show a regimen in which a magnitude of the frequency response $|U|$ may have different values for a same frequency value $\omega$.

A wide variety of nonlinear oscillator circuits may display such behavior, which may be observed as a result of increasing (decreasing) frequency of the driving signal.

One or more embodiments are based on the observation that jump resonance may actively be used, purposely designing a device showing such an otherwise detrimental physical phenomenon to facilitate the detection of the trend of frequency drifts in an oscillatory signal, e.g., an analog signal.

One or more embodiments comprise purposely designed and configured microcontroller-implemented discrete-time dynamical systems showing jump resonance to obtain a fast analysis of the input signal frequency and to detect increasing and/or decreasing trends.

In one or more embodiments, a discrete-time nonlinear core may be implemented in a microcontroller in a flexible way (e.g., programmable microcontroller), so that the nonlinear core may be reconfigurable "online", e.g. modifying a small set of parameters. For instance, obtaining the detection of frequency drifts in various bands may be facilitated by changing at least one parameter.

FIG. 1 is an exemplary frequency response of such a nonlinear oscillator.

As exemplified in FIG. 1, the frequency response U may present a hysteresis behavior, wherein the frequency response U may, for instance:
  follow a first "upper" branch $U_1$ of the curve when the frequency of the input signal increases,
  follow a second "lower" branch $U_2$ of the curve when the frequency of the input signal decreases.

Jump resonance is a phenomenon observed in nonlinear circuits where an output frequency response function (module) $|U|$ exhibits abrupt jumps when the frequency of the input signal is varied, for instance the output response may change its value from A to B if the frequency is reached from a higher value to a lower value, and change from B to A if the frequency $\omega_0$ is reached from a lower value to a upper value, as exemplified in FIG. 1.

The presence of a hysteretic curve in the frequency response U of a dynamical system is something unusual and, especially in control systems, worsens the control performance. Therefore, analysis is performed in control systems design with the aim of avoiding the parameter space in which jump resonance occurs.

Figure 2:
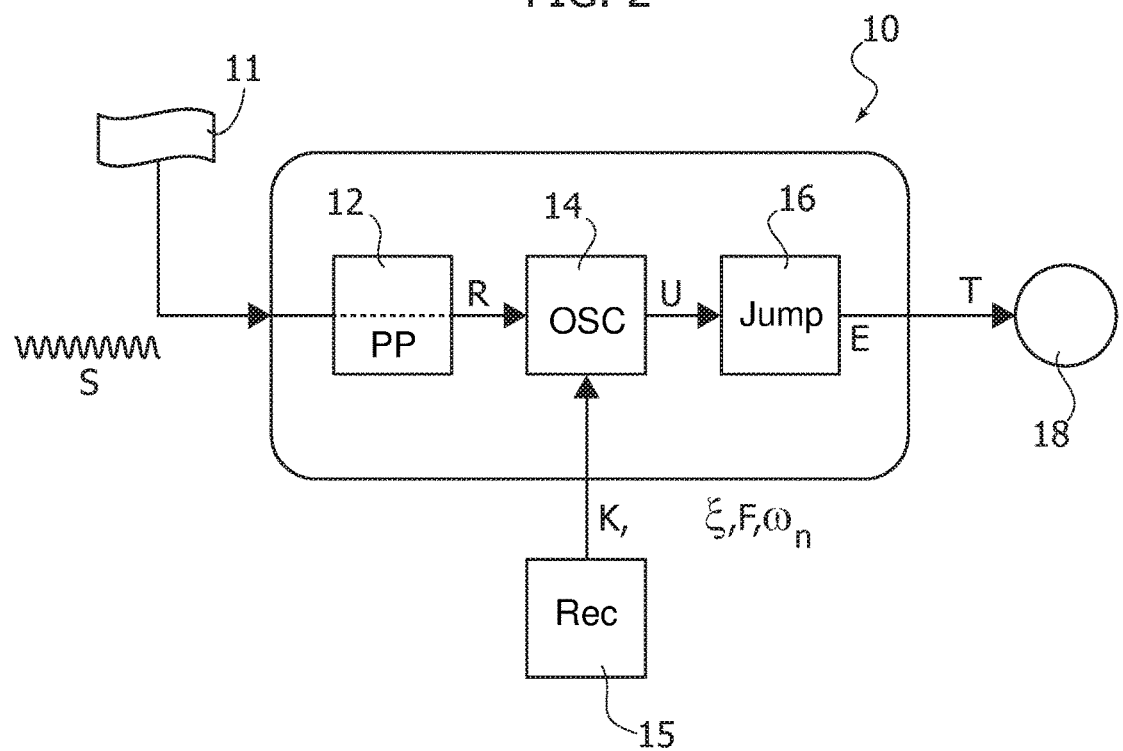
FIG. 2 is a diagram exemplary of an electronic device.

The Inventors have observed that such a (frequency-hysteresis) behavior may be advantageously exploited in an electronic device 10, as exemplified in FIG. 2, configured to provide an indicator of a frequency shift or drift in an oscillatory signal S, e.g., a power supply signal for a power grid.

One or more embodiments may comprise a frequency hysteresis-based circuit. Such a frequency hysteresis may differ from classical hysteresis-based circuits wherein a hysteresis phenomenon occurs in voltage/current or from ferromagnetic devices wherein a hysteresis occurs in magnetic field/flux.

In one or more embodiments, such an electronic device 10 may comprise:
  a pre-processing (PP) circuit 12, configured to receive the oscillatory signal S provided to the device 10 and to apply signal conditioning thereto, for instance attenuating or amplifying the signal (e.g., amplitude adjustment), providing as output a signal having a same frequency of the oscillatory signal S and amplitude characteristics suitable to drive the nonlinear oscillator circuit, as discussed in the following,
  a nonlinear oscillator (OSC) circuit 14, for instance a suitably configured microcontroller or second order IIR filter, depending on whether the input signal is a continuous or discrete time signal, configured to provide as an output a frequency response function in time U,
  a jump detection (processing) circuit 16, for instance a processing circuit to compute an envelope of the frequency response U or a comparator circuit configured to receive the frequency response and compare its value with one or more reference values.

In one or more embodiments, the jump detection circuit 16 may be configured to forward to a user circuit 18 a trigger or alert signal T in case a significant variation, e.g., above a certain threshold, of the value of an envelope of the response signal U is detected, indicative of a frequency jump happened in the frequency response.

One or more embodiments may optionally include a reconfiguration (Rec) circuit 15, coupled to the nonlinear circuit 14, wherein the reconfiguration circuit 15 (for instance, a computer) may be used to "tune" one or more design parameters, for instance a set of parameters $\omega_n$, K, F, ξ discussed in the following, facilitating using the device 10 also to measure an unknown period of a signal S fed thereto. For instance, if a signal having an unknown frequency f is fed to the circuit 14 and the circuit parameters are "swept" between different ranges of values, the value of the parameter, e.g., $\omega_n$ for which a trigger signal T is raised may be indicative of the frequency value of the unknown frequency f of the signal S.

One or more embodiments may comprise a method for detecting a change in oscillation frequency of an oscillatory signal, the method comprising:

providing a nonlinear oscillator circuit 14 behaving as a non-autonomous nonlinear system, e.g., having a frequency response as exemplified in FIG. 1 in a range of frequency including the oscillation frequency of the oscillatory signal, continuously feeding 12 the oscillatory signal as a driving signal to the nonlinear oscillator circuit 14, and forwarding an alert signal T to the user circuit 18 in case a frequency jump in the frequency response U of the device 14 is detected 16, for instance as a result of computing an envelope E and comparing it with at least one threshold as discussed in the following.

In one or more embodiments the alert signal T may, for instance, be an envelope signal E of the variation of the frequency response U in time of the circuit 14. For instance, if the frequency drift is positive, and there is an increase in drive signal frequency, the envelope T of the response U may have a negative trend during a time-interval reaching a first threshold, e.g., going from a higher value to a lower value. Such a negative trend may be indicative of a positive drift in the frequency.

Similarly, if the frequency drift is negative, and there is a decrease in drive signal frequency, the envelope T of the response U may have a positive trend, e.g., going from a lower value to a higher value during a time interval above a second threshold. Such a positive trend may be indicative of a negative drift in the frequency.

In one or more embodiments the user circuit 18 may comprise a control circuit coupled to a generator of the oscillatory signal S and capable of compensating such drift, until the envelope T value changes in the opposite direction.

In one or more embodiments, the user circuit 18 may comprise a control circuit which may be used to automatically take action, for instance in order to prevent a power grid failure. In one or more embodiments, the user circuit 18 may comprise interactive human-machine interfaces configured to alert human operators of the possibility of an impending power grid failure.

In one or more embodiments, data may be sent from the power grid line or may be sensed by a sensor coupled to the power grid.

It is noted that the device could be used in many other applications where frequency drift monitoring may be of interest, such as in the power electrical plants. For instance, the device can be used to detect vibrational behavior of mechanical systems, electromechanical systems, hydraulic systems, etc. where it may be an on-site low-cost sensor providing a general high-level monitoring platform, facilitating decision actions.

As a further remark, it is noted that one or more embodiments may employ an analog nonlinear oscillator circuit. At the same time, such an analog circuit may hardly provide an easy programmability of the device 14, therefore software adjustments are useful to reach an adequate performance.

Figure 3:
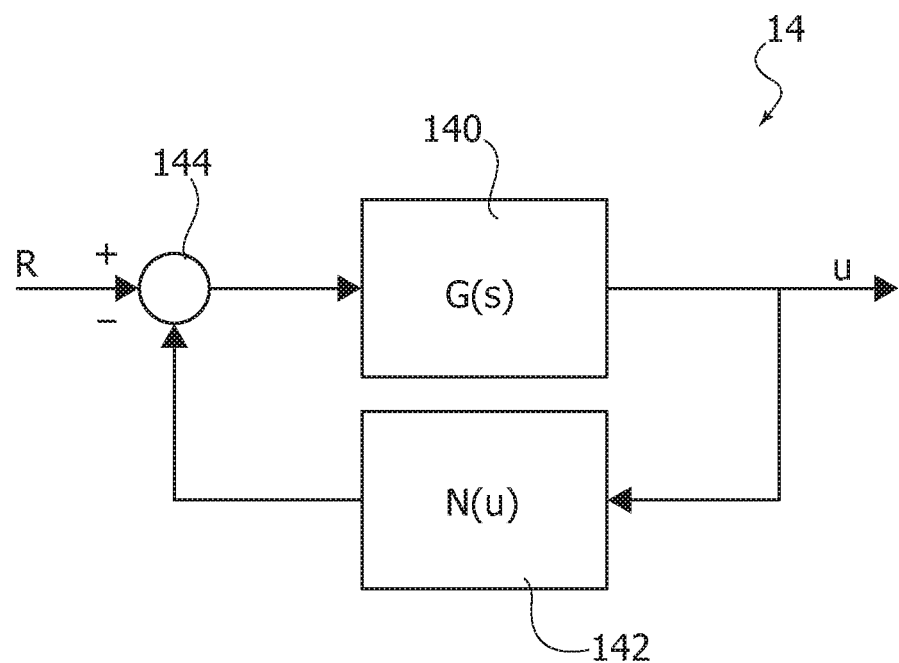
FIG. 3 is a diagram of an exemplary nonlinear circuit.

FIG. 3 is an exemplary diagram of a transfer function of the nonlinear oscillator circuit 14, which may be, for instance, a continuous-time jump resonance circuit.

In one or more embodiments, such a circuit 14 may have a resonance response U designed as a closed-loop system, composed by a continuous-time linear circuit portion 140 and a polynomial nonlinear circuit portion 142, wherein the nonlinear circuit portion forms a retroactive feedback branch for the linear circuit portion 140. In one or more embodiments, for instance, the nonlinear circuit portion 142 may be coupled between the linear portion 140 output and its input, being coupled to the input via an adder 144 which subtracts the feedback from the input.

In one or more embodiments, a quasilinear representation for a nonlinear element subjected to a sinusoidal input R, indicated as describing function DF, may be a function both of an amplitude and frequency of the input signal R.

In one or more embodiments, the modulus of the closed-loop response U of the system may be expressed as a polynomial whose order may be a function of the order of the polynomial nonlinearity, for instance as a result of applying a describing function DF approach.

In the following, principles underlying one or more embodiments are discussed with reference to an example of a third order nonlinearity, being otherwise understood that such a case is purely exemplary and in no way limiting.

In one or more embodiments, the linear circuit portion 140 may have a general second-order transfer function G(s) which may be expressed in the Laplace domain as:

$$G(s) = \frac{K\omega_n^2}{s^2 + 2\xi\omega_n s + \omega_n^2}$$

while a function N for the non-linear circuit portion 142 may be expressed as a cubic term, e.g.:

$$N(u) = u^3$$

wherein K, $\omega_n$ and ξ are design parameters and the coefficients of the polynomial nonlinearity.

Design parameters K, $\omega_n$ and ξ can be fixed imposing the desired solutions to the polynomial describing the modulus of the closed-loop response, as discussed in the following.

For the considered cubic nonlinearity, the describing function DF with sinusoidal inputs r may be expressed as:

$$N(U) = \frac{3}{4}U^2$$

so that the closed loop system response U may be expressed as:

$$\left[\frac{3}{4}U^2 + G^{-1}(j\omega)\right]U = Fe^{-i\psi}$$

where:
$G^{-1}(j\omega) = R(\omega) + jI(\omega)$ is the inverse transfer function of the linear circuit portion 140, and F and ψ are further design parameters.

For instance, imposing F=1, it follows that the expression of the closed loop system response U becomes:

$$\frac{3}{4}U^2 + (R + jI)U = e^{-i\psi}$$

Applying the modulus operator to the expression and considering ψ=0, the modulus of the equation above may be expressed as:

$$\frac{9}{16}U^6 + \frac{3}{2}R(\omega)U^4 + (R(\omega)^2 + I(\omega)^2)U^2 - 1 = 0$$

In order to have a window of jump resonance, the equation above is conditioned to provide three positive and real solutions U for a same value of ω.

Given a generic third order (dis)equation, which may be expressed as $$ax^3 + bx^2 + cx + d = 0$$

the condition to impose so that it admits three real roots may be expressed as:

$$H = \frac{E^2}{4} + \frac{F^3}{27} < 0$$

where $$E = \frac{2b^3 - 9bc + 27d}{27} \text{ and } F = \frac{3c - b^2}{3}$$

For instance, the sign of the obtainable three roots can be evaluated using a Routh table.

From the discussion in the foregoing, it follows that a set of conditions may be derived to design a nonlinear circuit 14 having a transfer function as exemplified in FIG. 3.

For instance, such condition may be expressed as:

$$c_1 I^6 + c_2 R^2 I^4 + (c_3 R^4 + \overline{c_3}R)I^2 + (c_4 + c_5 R^3) < 0$$

$$R < 0$$

$$\frac{R^2 + I^2}{A^2} + \frac{\overline{R}^2}{2AR} > 0$$

wherein $$c_1 = \frac{1}{27A^3}; c_2 = c_3 = \frac{2}{27A^6}; \overline{c_3} = \frac{\overline{R}^2}{3A^5}, c_4 = \frac{\overline{R}^4}{4A^4}; c_5 = \frac{\overline{R}^2}{27A^5}$$

Figure 4:
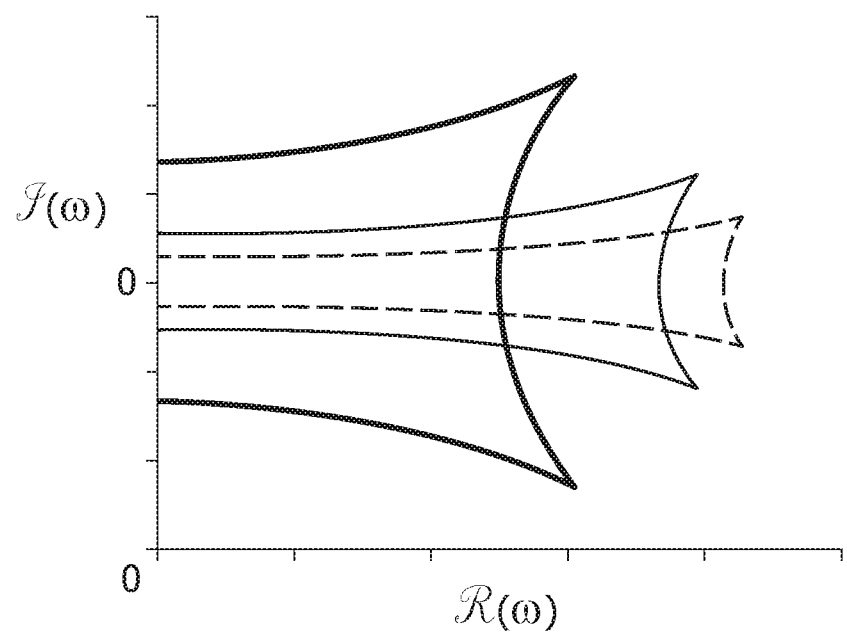
FIGS. 4 to 7 are diagrams of possible design parameters of the exemplary circuit of FIG. 3, FIGS. 8 and 9 are exemplary of possible time diagrams of signals in one or more embodiments.

FIG. 4 is an exemplary diagram of three possible curves obtained for different values of parameter F where three positive real solutions for U exist, providing the circuit 14 with the behavior of continuous-time jump resonance.

Starting from such continuous-time nonlinear circuit, a discrete-time nonlinear system may be obtained, purposely designing or providing a linear circuit portion and a nonlinear circuit portion in order to have jump resonance in the frequency response U.

For instance, the linear portion transfer function may be expressed in a time-discrete domain by applying a Tustin transformation to the transfer function in the Laplace domain. The Tustin transformation may be expressed as:

$$s = \frac{2}{T}\frac{z-1}{z+1}$$

and the linear circuit portion transfer function in the time-discrete domain G(z) may be expressed as:

$$G(z) = \frac{KT^2\omega_n^2(z+1)^2}{(T^2\omega_n^2 + T4\xi\omega_n + 4)z^2 + 2(T^2\omega_n^2 - 4)z + T^2\omega_n^2 - T4\xi\omega_n + 4}$$

A nonlinear circuit 14 having a time-discrete transfer function G(z) may be purposefully exploited in one or more embodiments of the electronic device 10 for frequency drift detection in the oscillatory signal S.

In one or more embodiments, the (discrete-time nonlinear) system may be implemented using a (purposely programmed) microcontroller device. For instance, a STM32F446 microcontroller by STMicroelectronics may be employed as such a microcontroller device.

In one or more embodiments, a second order Infinite Impulse Response, briefly IIR, filter may be purposely designed so that it shows a nonlinear behavior with jump frequency.

Considering a second order IIR filter transfer function in the discrete time domain, which may be expressed as:

$$H(z) = \frac{a_0 + a_1 z^{-1} + a_2 z^{-2}}{1 + b_1 z^{-1} + b_2 z^{-2}}$$

it follows that the coefficients $a_0$, $a_1$, $a_2$, $b_1$, $b_2$ may have values selected so that the polar diagram of the reciprocal (or the inverse) of H(z) crosses the regions of multiple solutions, for instance the regions exemplified with the curves in FIG. 4.

One or more embodiments may advantageously employ discrete-time non-linear oscillator 14, wherein the frequency response U may be an oscillatory function repeating with periodicity 2π. In one or more embodiments, it may be possible to select the frequency range in which hysteresis occurs as a function of the sampling time in the time-discrete system, improving flexibility of the device 10 facilitating reconfigurability.

Figure 5:
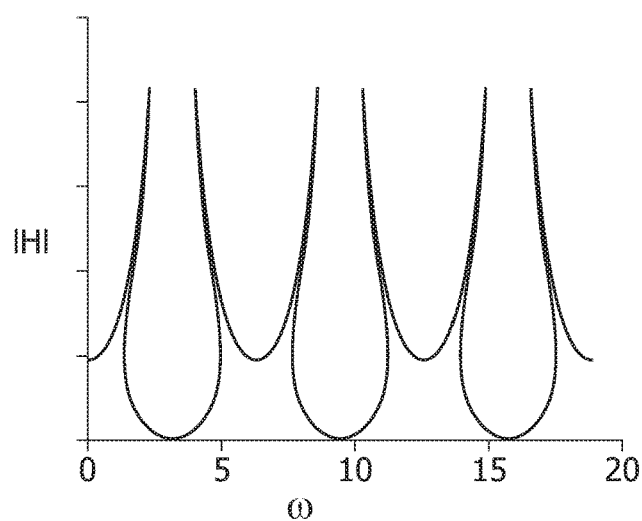

FIG. 5 is an exemplary diagram of a transfer function of a time-discrete nonlinear oscillator transfer function, which may be, for instance, obtained by selecting IIR filter parameters as discussed in the foregoing. A further added-value of discrete-time systems is that the frequency response repeats with periodicity 2π. This implies that, modifying the sampling time in the device, it is possible to select the desired frequency range in which hysteresis occurs. Therefore, reconfigurability is ensured maintaining system parameters.

Figure 6:
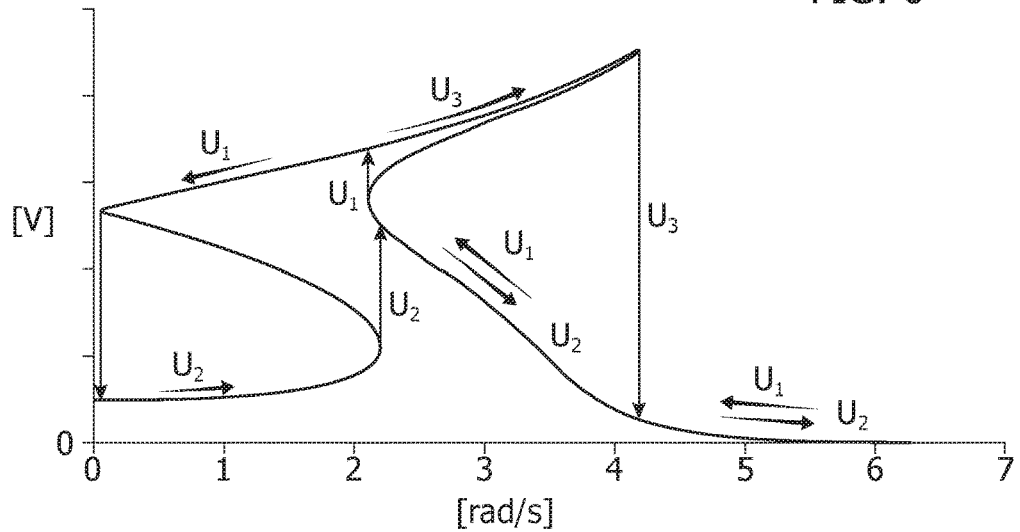
Figure 7:
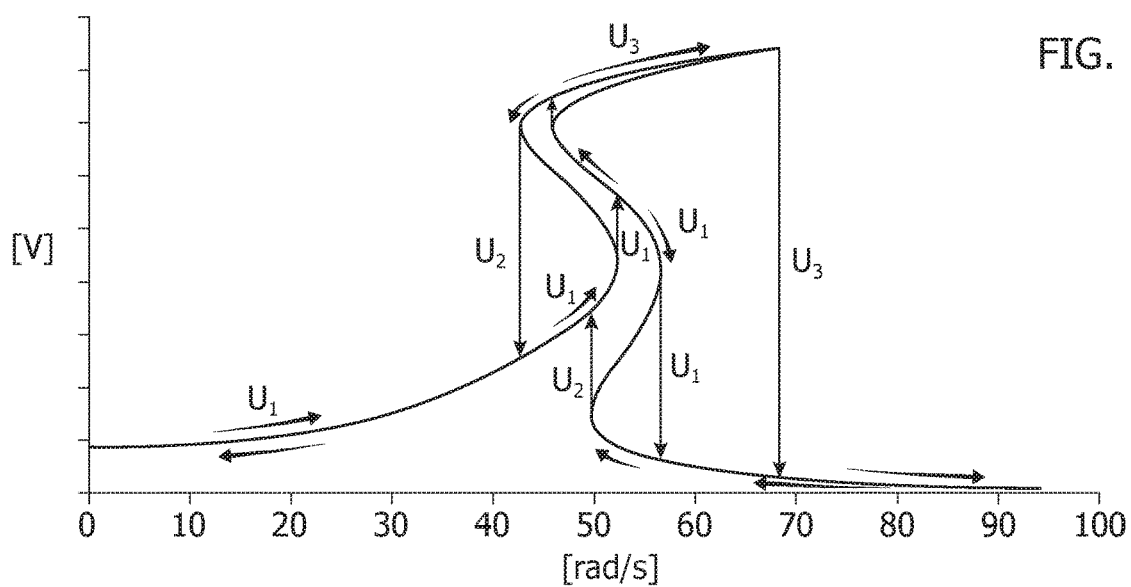

One or more embodiments may employ, as mentioned, an odd nonlinearity of higher order than three, such as a quintic (see for instance FIG. 6) or septic (see for instance FIG. 7) polynomial. The use of a nonlinear circuit having a frequency response as exemplified in FIG. 6 or 7, for instance, may lead to a higher number of jumps in the frequency response and, therefore, to a higher selectivity. For instance, as exemplified in FIGS. 6 and/or 7, the frequency response U may present a multiple hysteresis behavior, wherein the frequency response U may, for instance:

follow a first branch $U_1$ of the curve when the frequency of the input signal increases, follows a second branch $U_2$ of the curve when the frequency of the input signal decreases, follows a third branch $U_3$ of the curve when the frequency of the input signal decreases after an increase or increases after a decrease.

In one or more embodiments of the device 10, thanks to such a higher selectivity, may detect drifts occurring in different combinations of directions at different frequencies. For instance, the oscillatory signal S can be a wideband signal and it may be possible to detect a plurality of frequency drifts with the device 10 having a quintic or septic nonlinearity.

Figure 8:
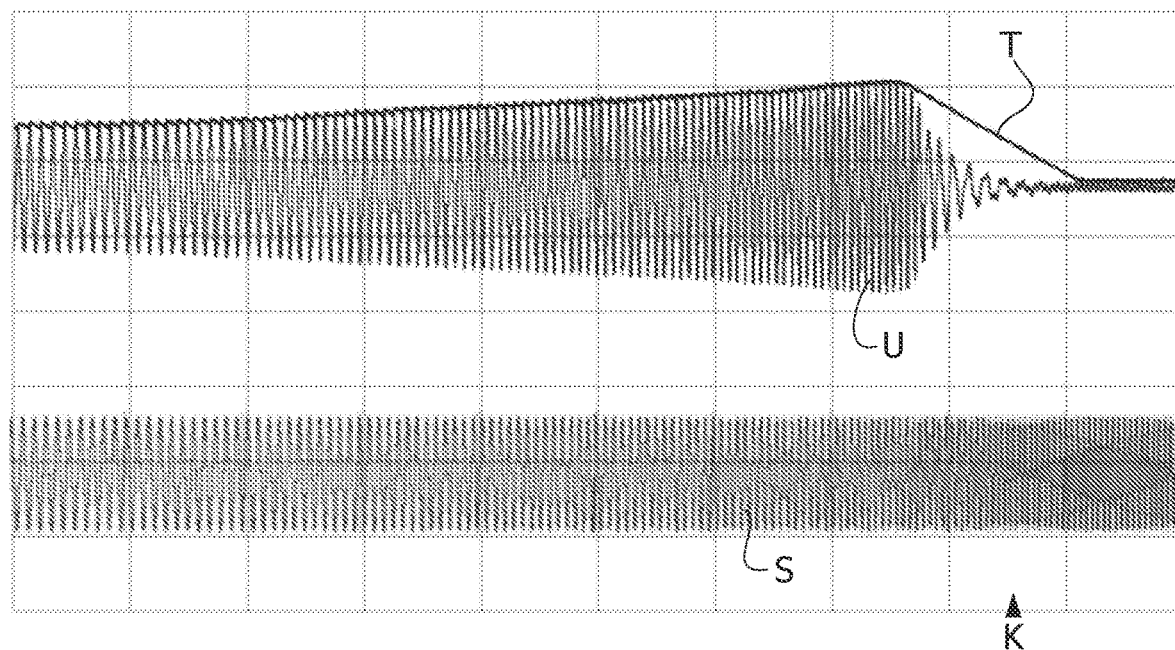

FIG. 8 is exemplary of a frequency response of the nonlinear circuit 14 produced as a result of processing an input signal being fed with a frequency "sweep", e.g. a signal whose frequency may increase with time from a lower frequency of, e.g., 100 Hz to a higher frequency of, e.g., 200 Hz.

As exemplified in FIG. 8, at time k the system may jump and the envelope T may change consistently for a certain time interval, e.g., above (and/or equal to, or below) certain threshold(s) value(s), providing an indication of an oscillatory signal frequency drift. In one or more embodiments, the trend of the envelope signal T may be provided to user circuits as indicator of a frequency drift to be forwarded to alert the control signal of the power grid.

A consequence of purposely designing such nonlinear oscillator 14 is that its frequency response U is known, at least within a certain frequency range. As a result, if an oscillatory signal S having an unknown oscillation frequency is fed to the nonlinear circuit 14 and the unknown oscillatory frequency lies within the frequency response U of the nonlinear circuit 14, it may be measured. Such a measurement, advantageously, may not use any time to frequency transformation and may be the result of the jump detection circuit 16 detecting a jump: the oscillation frequency of the signal input is hence the detected jump frequency.

Figure 9:
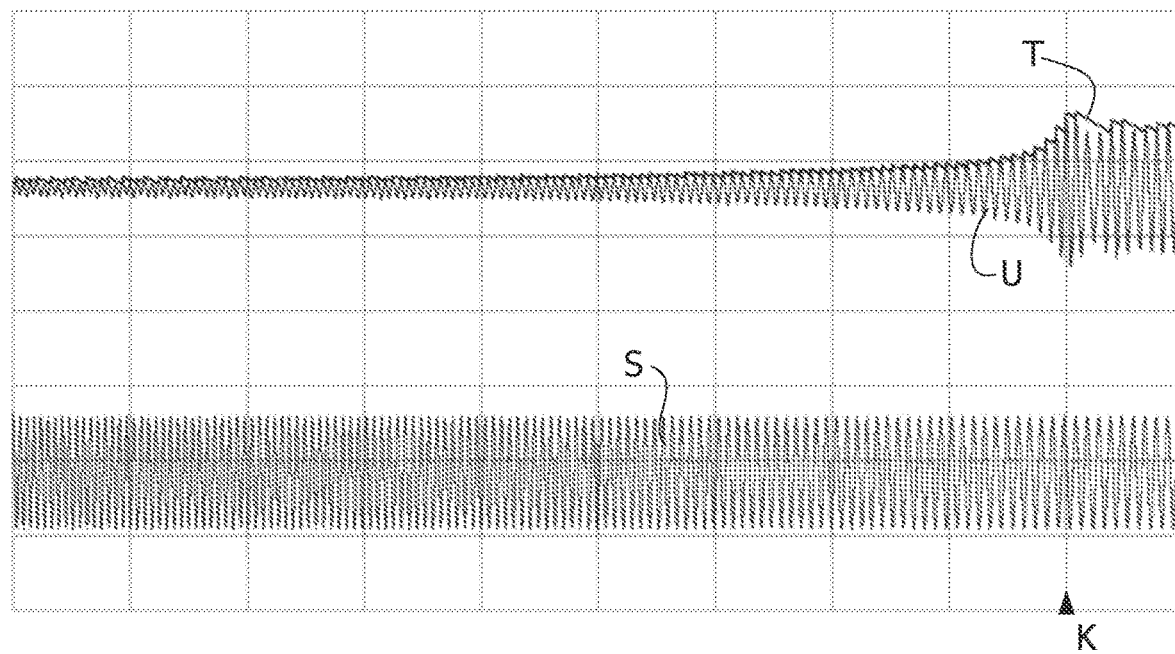

FIG. 9 is an example of usage of the system as a frequency measurement circuit or detector. The set of design parameters $\omega_n$, K, ξ of the nonlinear system may be configurable "online", for instance using a dedicated control circuit 15, while the signal S having a certain frequency, e.g. 150 Hz, is fed to the nonlinear circuit 14.

As exemplified in FIG. 9, the envelope of the frequency response U shows a jump at time K which lasts for a time interval above a second threshold, so that the frequency value at which the jump is detected is a measure of the frequency of the fed signal (at time K).

One or more embodiments may comprise an electronic device (for instance, 10), comprising:

an input node configured to receive an oscillatory electric signal (for instance, S), the oscillatory electric signal having an oscillation frequency, a processing circuit (for instance, 12) coupled to said input node and configured to apply time-sampling to said oscillatory electric signal and provide a sampled oscillatory electric signal (for instance, R), a nonlinear circuit (for instance, 14) configured to receive said sampled oscillatory electric signal (for instance, R), the nonlinear oscillator circuit driven by said sampled oscillatory electric signal to output a hysteretic response signal (for instance, U) as a function of said sampled oscillatory electric signal, wherein said hysteretic response signal has a frequency in a first frequency range (for instance, $U_1$) as a result of an increase in the oscillation frequency of the oscillatory electric signal, and in a second frequency range (for instance, $U_2$) as a result of a decrease in the oscillation frequency of the oscillatory electric signal, a detection circuit (for instance, 16) coupled to said nonlinear circuit and configured to receive said hysteretic response signal therefrom, the detection circuit (16) configured to compute an envelope signal (for instance, E) of said hysteretic response signal, perform a comparison of said envelope signal with at least one threshold, and produce a signal (for instance, T) indicative of an increase or a decrease in the oscillation frequency of the oscillatory electric signal as a result of the outcome of said comparison.

In one or more embodiments, the processing circuit may be configured to adjust an amplitude of said sampled oscillatory electric signal.

In one or more embodiments, as mentioned, the nonlinear circuit (for instance, 14) may comprise a (purposely programmed) microcontroller-based circuit.

In one or more embodiments, said nonlinear circuit may have a hysteretic frequency response (for instance, U) which satisfies an expression:

$$\frac{9}{16}U^6 + \frac{3}{2}R(\omega)U^4 + (R(\omega)^2 + I(\omega)^2)U^2 - 1 = 0$$

wherein $G(j\omega)=R(\omega)+jI(\omega)$ is a linear portion of the hysteretic frequency response (for instance, U) and $$N(U) = \frac{3}{4}U^2$$

is a describing function DF of a nonlinear portion of the hysteretic frequency response.

In one or more embodiments, the nonlinear circuit (hysteretic 14) may comprise an Infinite Impulse Response (IIR) filter.

In one or more embodiments, the IIR filter may be configured to have a hysteretic frequency response H(z) which satisfies an expression:

$$H(z) = \frac{a_0 + a_1 z^{-1} + a_2 z^{-2}}{1 + b_1 z^{-1} + b_2 z^{-2}}$$

wherein coefficients $a_0$, $a_1$, $a_2$, $b_1$, $b_2$ have values selected so that the polar diagram of the reciprocal of H(z) crosses a region of the complex plane comprising multiple values of z.

One or more embodiments may comprise an electronic apparatus, comprising:
- one or more embodiments of an electronic device (for instance, 10),
- an oscillatory signal generator (for instance, 11) coupled to said electronic device and feeding an oscillatory electronic signal (for instance, S) having an oscillation frequency thereto,
- a user circuit (for instance, 18) coupled to said electronic device and to said oscillatory signal generator, the user circuit configured to operate said oscillatory signal generator as a function of said signal (for instance, T) indicative of an increase or a decrease in the oscillation frequency of the oscillatory electric signal.

In one or more embodiments of the electronic apparatus, said oscillatory signal generator may be a power grid supply signal generator and said oscillation frequency may be equal to 50 Hz or 60 Hz.

One or more embodiments may comprise a method, comprising:
- receiving an oscillatory electric signal (for instance, S), the oscillatory signal having an oscillation frequency,
- applying time-sampling (for instance, 12) to said oscillatory electric signal and providing a sampled oscillatory electric signal (for instance, R),
- configuring a nonlinear processing circuit (for instance, 14) to output a hysteretic response signal (for instance, U) when driven by said sampled oscillatory electric signal, wherein said hysteretic response signal has a frequency in a first frequency range (for instance, $U_1$) as a result of an increase in the oscillation frequency of the oscillatory electric signal, and in a second frequency range (for instance, $U_2$) as a result of a decrease in the oscillation frequency of the oscillatory electric signal,
- driving said configured a nonlinear processing circuit by said sampled oscillatory electric signal,
- computing (for instance, 16) an envelope signal (for instance, E) of said hysteretic response signal (for instance, U),
- performing a comparison of said envelope signal with at least one threshold, and
- producing a signal (for instance, T) indicative of an increase or a decrease in the oscillation frequency of the oscillatory electric signal as a result of the outcome of said comparison.

In one or more embodiments, the method may comprise:
- configuring said nonlinear processing circuit (for instance, 14) to output a plurality of hysteretic response signals (U), and
- computing (for instance, 16) an envelope signal (for instance, E) of said plurality of hysteretic response signals (for instance, U), performing a comparison of said envelope signal with at least one threshold and producing a signal (for instance, T) indicative of an oscillation frequency of the oscillatory electric signal as a result of the outcome of said comparison.

One or more embodiments may comprise a computer program product loadable into the memory of at least one processing circuit (for instance, 14) and comprising software code portion implementing the method of any of claims 9 to 10 when run on said processing circuit (for instance, 14).

It will be otherwise understood that the various individual implementing options exemplified throughout the figures accompanying this description are not necessarily intended to be adopted in the same combinations exemplified in the figures. One or more embodiments may thus adopt these (otherwise non-mandatory) options individually and/or in different combinations with respect to the combination exemplified in the accompanying figures.

The claims are an integral part of the technical teaching provided herein with reference to the embodiments.

Without prejudice to the underlying principles, the details and embodiments may vary, even significantly, with respect to what has been described by way of example only, without departing from the extent of protection. The extent of protection is defined by the annexed claims.

The invention claimed is:

1. An electronic device, comprising:
- an input node configured to receive an oscillatory electric signal that has an oscillation frequency;
- a processing circuit coupled to said input node and configured to apply time-sampling to said oscillatory electric signal and provide a sampled oscillatory electric signal;
- a nonlinear circuit configured to receive said sampled oscillatory electric signal, wherein the nonlinear oscillator circuit is driven by said sampled oscillatory electric signal to output a hysteretic response signal as a function of said sampled oscillatory electric signal, wherein said hysteretic response signal has a frequency in a first frequency range as a result of an increase in the oscillation frequency of the oscillatory electric signal, and has a frequency in a second frequency range as a result of a decrease in the oscillation frequency of the oscillatory electric signal; and
- a detection circuit coupled to receive said hysteretic response signal from said nonlinear circuit and configured to compute an envelope signal of said hysteretic response signal, perform a comparison of said envelope signal with at least one threshold, and produce a signal indicative of one of an increase or a decrease in the oscillation frequency of the oscillatory electric signal as a result of the outcome of said comparison.

2. The electronic device of claim 1, wherein the processing circuit is configured to adjust an amplitude of said sampled oscillatory electric signal.

3. The electronic device of claim 1, wherein the nonlinear circuit comprises a microcontroller-based circuit.

4. The electronic device of claim 1, wherein said nonlinear circuit has a hysteretic frequency response which satisfies an expression:

$$\frac{9}{16}U^6 + \frac{3}{2}R(\omega)U^4 + (R(\omega)^2 + I(\omega)^2)U^2 - 1 = 0$$

wherein $G(j\omega)=R(\omega)+jI(\omega)$ is a linear portion of the frequency response and $$N(U) = \frac{3}{4}U^2$$

is a describing function (DF) of a nonlinear portion of the frequency response.

5. The electronic device of claim 1, wherein the nonlinear circuit comprises an Infinite Impulse Response (IIR) filter.

6. The electronic device of claim 5, wherein the IIR filter is configured to have a hysteretic frequency response H(z) which satisfies an expression:

$$H(z) = \frac{a_0 + a_1 z^{-1} + a_2 z^{-2}}{1 + b_1 z^{-1} + b_2 z^{-2}}$$

wherein coefficients $a_0$, $a_1$, $a_2$, $b_1$, $b_2$ have values selected so that the polar diagram of the reciprocal of H(z) crosses a region of the complex plane comprising multiple values of z.

7. The electronic device of claim 1, further comprising:
an oscillatory signal generator configured to generate the oscillatory electronic signal;
a user circuit configured to operate said oscillatory signal generator as a function of said signal indicative of an increase or a decrease in the oscillation frequency of the oscillatory electric signal.

8. The electronic device of claim 7, wherein said oscillatory signal generator is a power grid supply signal generator and wherein said oscillation frequency is equal to 50 Hz or 60 Hz.

9. A method, comprising:
receiving an oscillatory electric signal that has an oscillation frequency;
applying time-sampling to said oscillatory electric signal to provide a sampled oscillatory electric signal;
performing a nonlinear processing on the sampled oscillatory electric signal to output a hysteretic response signal, wherein said hysteretic response signal has a frequency in a first frequency range as a result of an increase in the oscillation frequency of the oscillatory electric signal, and has a frequency in a second frequency range as a result of a decrease in the oscillation frequency of the oscillatory electric signal;
computing an envelope signal of said hysteretic response signal;
performing a comparison of said envelope signal with at least one threshold; and
producing a signal indicative of one of an increase or a decrease in the oscillation frequency of the oscillatory electric signal as a result of the outcome of said comparison.

10. The method of claim 9, comprising:
configuring a nonlinear processing circuit which performs the nonlinear processing to output a plurality of hysteretic response signals; and
wherein computing comprises computing the envelope signal of said plurality of hysteretic response signals.

11. A computer program product loadable into a memory of a processing circuit and comprising a software code portion implementing a method according to claim 9 when the software code portion is executed by said processing circuit.

* * * * *